United States Patent [19]

Grandfield

[11] Patent Number: 5,448,772
[45] Date of Patent: Sep. 5, 1995

[54] STACKED DOUBLE BALANCED MIXER CIRCUIT

[75] Inventor: Walter J. Grandfield, Lake Worth, Fla.

[73] Assignee: Motorola, Inc., Schaumburg, Ill.

[21] Appl. No.: 297,072

[22] Filed: Aug. 29, 1994

[51] Int. Cl.6 .......... H04B 1/28; H03B 19/00
[52] U.S. Cl. .......... 455/333; 455/326; 327/357
[58] Field of Search .......... 455/323, 326, 332, 333, 455/313, 315, 318; 327/355, 357; 328/158

[56] References Cited

U.S. PATENT DOCUMENTS

| | | | |
|---|---|---|---|
| 4,216,431 | 8/1980 | Shibata et al. | 455/333 |
| 4,695,940 | 9/1987 | Rein | 455/326 |
| 5,379,457 | 1/1995 | Nguyen | 455/323 |

FOREIGN PATENT DOCUMENTS

| | | | |
|---|---|---|---|
| 3533104 | 4/1987 | Germany | 455/333 |
| 55-11687 | 1/1980 | Japan | 455/333 |
| 62-294305 | 12/1987 | Japan | 455/333 |
| 2113710 | 4/1990 | Japan | 455/333 |
| 2190011 | 7/1990 | Japan | 455/333 |
| 4240904 | 8/1992 | Japan | 455/333 |

OTHER PUBLICATIONS

"Analysis and Design of Analog Integrated Circuits", By Gray and Meyer, 1977 Wiley & Sons, Inc., p. 564.

*Primary Examiner*—Edward F. Urban
*Assistant Examiner*—Lisa Charouel
*Attorney, Agent, or Firm*—James A. Lamb

[57] ABSTRACT

A stacked double balanced mixer (220) includes a double balanced mixer (320) and a first cross coupled differential mixer (330). The double balanced mixer (320) includes two input transistors (321, 322) and four cross coupled output transistors (323-326). The first cross coupled differential mixer (330) includes four cross coupled input/output transistors (331-334) and a second mixer output (227, 228). The four cross coupled input/output transistors (331-334) have first output terminal pairs DC coupled in series to second output terminal pairs of the four cross coupled output transistors (323-326). The stacked double balanced mixer (220) generates, at the second mixer output (227,228), a second IF differential output signal having a second IF frequency at a difference of a radio frequency of a differential input signal and the sum of first and second LO frequencies, respectively, of first and second LO signals.

19 Claims, 4 Drawing Sheets

STACKED DOUBLE BALANCED MIXER CIRCUIT

FIELD OF THE INVENTION

This invention relates in general to circuits for converting a received radio frequency signal and in particular to circuits for converting a received radio frequency signal by mixing the received radio frequency signal with two local oscillator signals.

BACKGROUND OF THE INVENTION

Frequency conversion of an intercepted radio frequency signal by mixing with one or more local oscillator signals is a well known technique used in radio receivers to convert the carrier frequency of the intercepted radio frequency signal to a lower, intermediate frequency (IF) signal. The IF signal is then demodulated to recover information which has been included in the intercepted signal. In one class of receivers, sometimes referred to as "zero IF" receivers, the intercepted signal is mixed with the one or more local oscillator signals to produce an IF signal having no carrier frequency. In such zero IF receivers, dual conversion is often used, wherein a first local oscillator signal is mixed with the intercepted signal, thereby producing a first IF signal, which is then mixed with a second local oscillator signal to produce a second IF signal having no carrier frequency. Dual conversion receivers are also used in receivers which are not zero IF receivers, that is, the demodulation is performed using a second IF signal having a carrier frequency.

Known means of performing the mixing in dual conversion receivers are to use a first transistor circuit commonly identified as a Gilbert cell to generate the first IF signal, which is fed into the inputs of a second Gilbert cell transistor circuit to produce the second IF. While series connected mixer circuit approaches such as the Gilbert cell approach described above have worked well, each mixer circuit is typically independently powered from a common power supply, and the mixer circuits must be carefully matched to each other to reduce the generation of undesirable distortions of the signal, such as intermodulation distortion. In radio receivers which are portable and competitively priced, such as pagers, minimal circuitry, low power consumption, receiver sensitivity performance, and receiver intermodulation performance are extremely important characteristics.

Thus, what is needed is a mixer circuit for performing dual conversion which has lower power consumption, fewer parts, and less distortion.

SUMMARY OF THE INVENTION

Accordingly, in a first aspect of the present invention, a stacked double balanced mixer includes a double balanced mixer and a first cross coupled differential mixer. The double balanced mixer includes two input transistors, four cross coupled output transistors, a first input coupled to a radio frequency (RF) differential signal having an RF carrier frequency, and a second input coupled to a first local oscillator (LO) differential signal having a first LO frequency. The first cross coupled differential mixer includes four cross coupled input/output transistors, a second LO input coupled to a second local oscillator (LO) differential signal having a second LO frequency and a second mixer output. The four cross coupled input/output transistors have first output terminal pairs DC coupled in series to second output terminal pairs of includes four cross coupled output transistors of includes double balanced mixer. The stacked double balanced mixer generates, at the second mixer output, a second IF differential output signal having a second IF frequency at a difference of the RF frequency and a sum of the first and the second LO frequencies.

Accordingly, in a second aspect of the present invention, a receiving device is for processing a frequency modulated (FM) radio signal having a carrier frequency. The FM radio signal includes a selective call address. The receiving device includes an antenna, a receiver section, a controller, and a sensible alert. The antenna is for intercepting the FM signal. The receiver section, which is coupled to the antenna, is for filtering, converting, and demodulating the intercepted FM signal, including the selective call address. The controller, which is coupled to the receiver section, decodes the demodulated selective call address. The controller also generates an alert signal when the selective call address substantially matches an address stored in the portable receiving device. The sensible alert, which is coupled to the controller, is responsive to the alert signal for generating a sensible alert. The receiver section includes a stacked double balanced mixer, is coupled to the antenna, and is for converting the intercepted FM signal to an intermediate frequency (IF) signal. The stacked double balanced mixer includes a double balanced mixer and a first cross coupled differential mixer.

The double balanced mixer includes two input transistors, four cross coupled output transistors, a first input coupled to a radio frequency (RF) differential signal having an RF carrier frequency, and a second input coupled to a first local oscillator (LO) differential signal having a first LO frequency. The first cross coupled differential mixer includes four cross coupled input/output transistors, a second LO input coupled to a second local oscillator (LO) differential signal having a second LO frequency and a second mixer output. The four cross coupled input/output transistors have first output terminal pairs DC coupled in series to second output terminal pairs of includes four cross coupled output transistors of includes double balanced mixer. The stacked double balanced mixer generates, at the second mixer output, a second IF differential output signal having a second IF frequency at a difference of the RF frequency and a sum of the first and the second LO frequencies.

Accordingly, in a third aspect of the present invention, a stacked double balanced mixer includes a double balanced mixer and a cross coupled differential mixer. The double balanced mixer includes two NPN input transistors, four cross coupled output transistors, a first input and a second input. Each of the two input transistors has a collector which is direct current (DC) coupled to one of two emitter pairs of the four cross coupled output transistors. The first input includes two bases. Each of the two bases is a base of one of the two input transistors. The first input is coupled to a radio frequency (RF) differential signal having an RF carrier frequency. The second input includes two emitter pairs of the four cross coupled output transistors. The second input is coupled to a first local oscillator (LO) differential signal having a first LO frequency.

The first cross coupled differential mixer includes four cross coupled input/output transistors having emitter pairs DC coupled in series to collector pairs of the four cross coupled output transistors, a second LO input, and a second mixer output. The second LO input includes two base pairs of the four cross coupled input/output transistors and is coupled to a second local oscillator (LO) differential signal having a second LO frequency. The second mixer output includes two collector pairs of the four cross coupled input/output transistors and generates, at the second mixer output, a second IF differential output signal having a second IF frequency at a difference of the RF frequency and a sum of the first and the second LO frequencies. The double balanced mixer and the first cross coupled differential mixer are implemented on the same integrated circuit substrate.

DETAILED DESCRIPTION OF THE INVENTION

Figure 1:
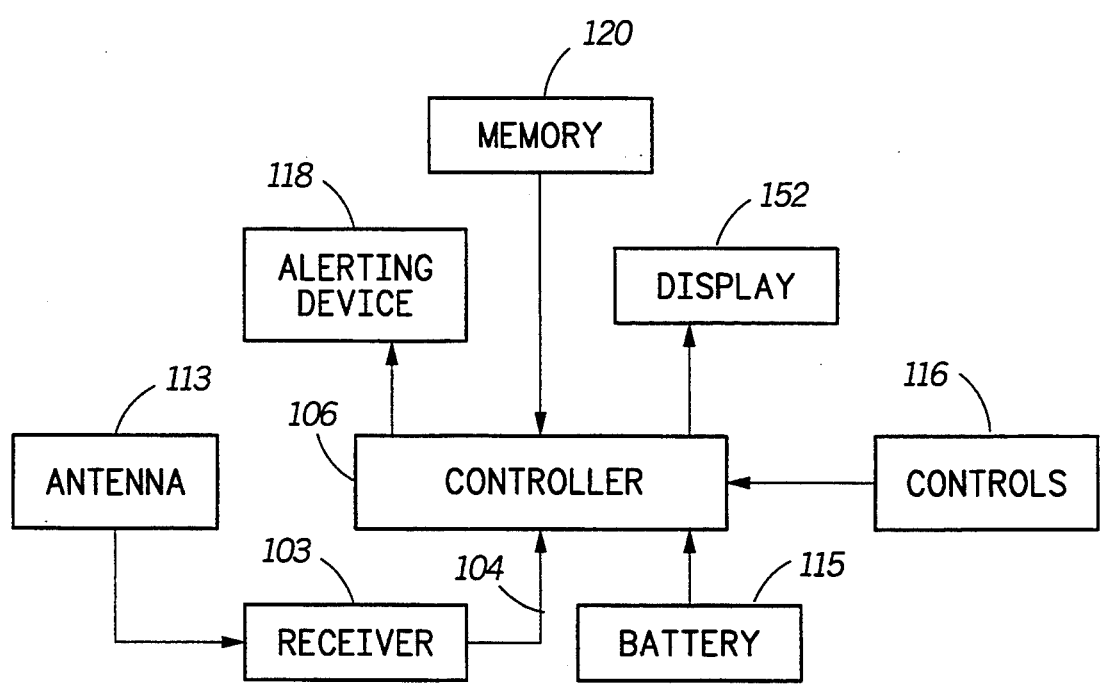
FIG. 1 is an electrical block diagram of a portable receiving device, in accordance with the preferred embodiment of the present invention.

Referring to FIG. 1, an electrical block diagram is shown of a portable receiving device 100, in accordance with the preferred embodiment of the present invention. The portable receiving device 100 operates to intercept a radio signal via a conventional antenna 113, which is coupled to a dual conversion receiver 103. The dual conversion receiver 103 operates to filter, convert, and demodulate the received digital radio signal and couples a demodulated radio signal 104 to a controller 106, the controller 106 comprising conventional control logic for decoding and recovering a selective call message contained within the radio signal, in a manner well known in the art. The selective call message includes an address and may include other information such as a telephone number, alphanumeric data, or graphics. A conventional address memory 120 which stores a predetermined address is coupled to the controller 106. The controller 106 is coupled to a battery 115, for distributing power from the battery 115 to other circuits in the portable receiving device 100, including the dual conversion receiver 103. The controller 106 is further coupled to operator controls 116, a display 152, and a sensible alerting device 118. The controls 116, display, and alerting device 118 are of conventional design. The controller 106 compares the address recovered from the selective call message to the predetermined address stored in the address memory 120 and continues processing the message when the comparison meets predetermined criteria in a manner well known in the art. When the comparison does not meet the predetermined criteria, the controller 106 stops the processing of the selective call message. As determined by the contents of the recovered selective call message and the settings of operator controls 116, the portable receiving device 100 may further process the selective call message by presenting at least a portion of the selective call message, using the display 152, and by signaling the user via the sensible alerting device 118 that a selective call message has been received. The information which is displayed can include a short message such as a phone number or a longer message such as a alphanumeric inquiry or a small map, any of which can be presented on the display 152 by manipulation of the operator controls 116 on the portable receiving device 100. It will be appreciated that the portable receiving device 100 could be of the type which also transmits messages and/or acknowledgments by means of radio signals.

The portable receiving device 100 is preferably similar to a Memo Express ® model pager, manufactured by Motorola, Inc., of Schaumburg, Ill., modified to use the dual conversion receiver 103, but may alternatively may be another portable receiving device radio, similarly modified. The controller 106 in the Memo Express ® model pager is a microprocessor of the model 68HC05 family of microprocessors manufactured by Motorola, Inc. of Schaumburg, Ill. This is the preferred implementation of the controller 106, but alternative microprocessors or integrated logic circuits may also be used.

The portable receiving device 100 is representative of many other receiving devices which include dual conversion receivers that can benefit from the present invention. Examples of such other receiving devices are cellular telephones, television receivers, and broadcast communication receivers, which may or may not be portable. Other examples are optical and electrical communication receivers, such as those used in modems.

Figure 2:
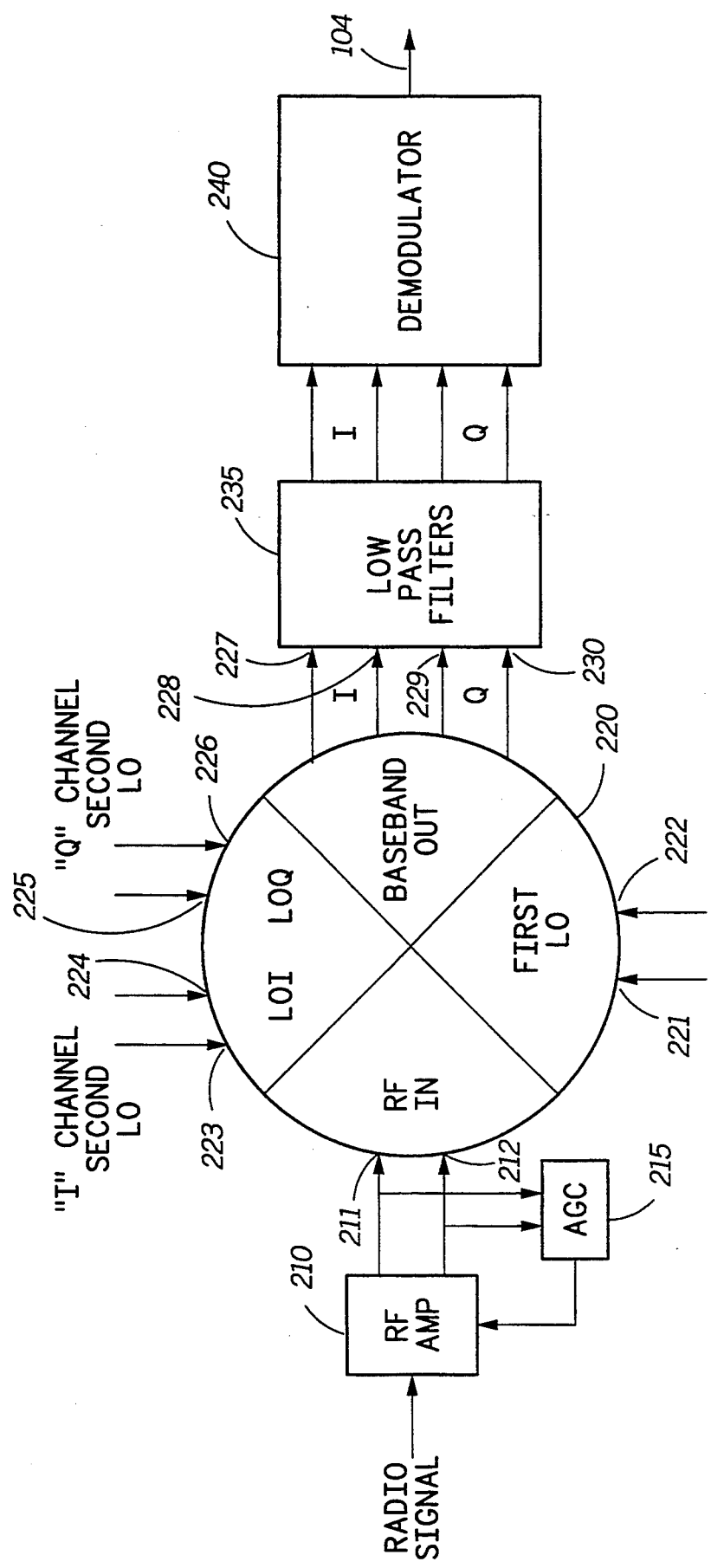
FIG. 2 is an electrical block diagram of a dual conversion receiver used in the portable receiving device, in accordance with the preferred embodiment of the present invention.

Referring to FIG. 2, an electrical block diagram of the dual conversion receiver 103 used in the portable receiving device 100 is shown, in accordance with the preferred embodiment of the present invention. The intercepted radio signal is coupled to a radio frequency (RF) amplifier 210 of conventional design which amplifies the intercepted radio signal and generates an amplified, RF differential signal. The amplified, RF differential signal is coupled to an automatic gain control (AGC) circuit 215 of conventional design and to first differential inputs 211, 212 of a stacked double balanced mixer 220. The AGC circuit 215 operates to detect the strength of the amplified, RF differential signal and generate a control signal which is coupled to the RF amplifier 210 for maintaining the amplitude of the amplified, RF differential signal within an predetermined range, in a manner well known to one of ordinary skill in the art. The stacked double balanced mixer 220, which is of unique design, mixes the amplified, RF differential signal with a first local oscillator (LO) differential signal, and two second LO differential signals. The first LO differential signal comprises plus and minus first LO differential signals coupled to second differential inputs 221, 222 of the stacked double balanced mixer 220. The two second local oscillator differential signals are an in-phase second local oscillator differential (I) signal and a quadrature phase second local oscillator differential (Q) signal. The I signal has plus and minus components which are coupled to second differential inputs 223, 224 of the stacked double balanced mixer 220. The Q signal has plus and minus components which are coupled to third differential inputs 225, 226 of the stacked double balanced mixer 220. The I and Q signals are at the same frequency, but the Q signal is 90° out of phase with the I signal. The stacked double balanced mixer 220 according to the preferred embodiment of the present invention generates I and Q baseband output differential signals (that is, I and Q signals having no carrier frequency), at differential outputs 227, 228, 229, and 230 of the stacked double balanced mixer 220. The I and Q baseband output differential signals include undesirable frequency components. The I and Q baseband output differential signals are coupled to a low pass filter 235. The low pass filter 235, which is of conventional design, removes the undesirable frequency components from the baseband output differential signals, passing filtered I and Q baseband output differential signals which are coupled to a demodulator 240 of conventional design. The demodulator 240 generates the demodulated radio signal 104 from the filtered I and Q baseband output differential signals in a manner well known to one of ordinary skill in the art.

Figure 3:
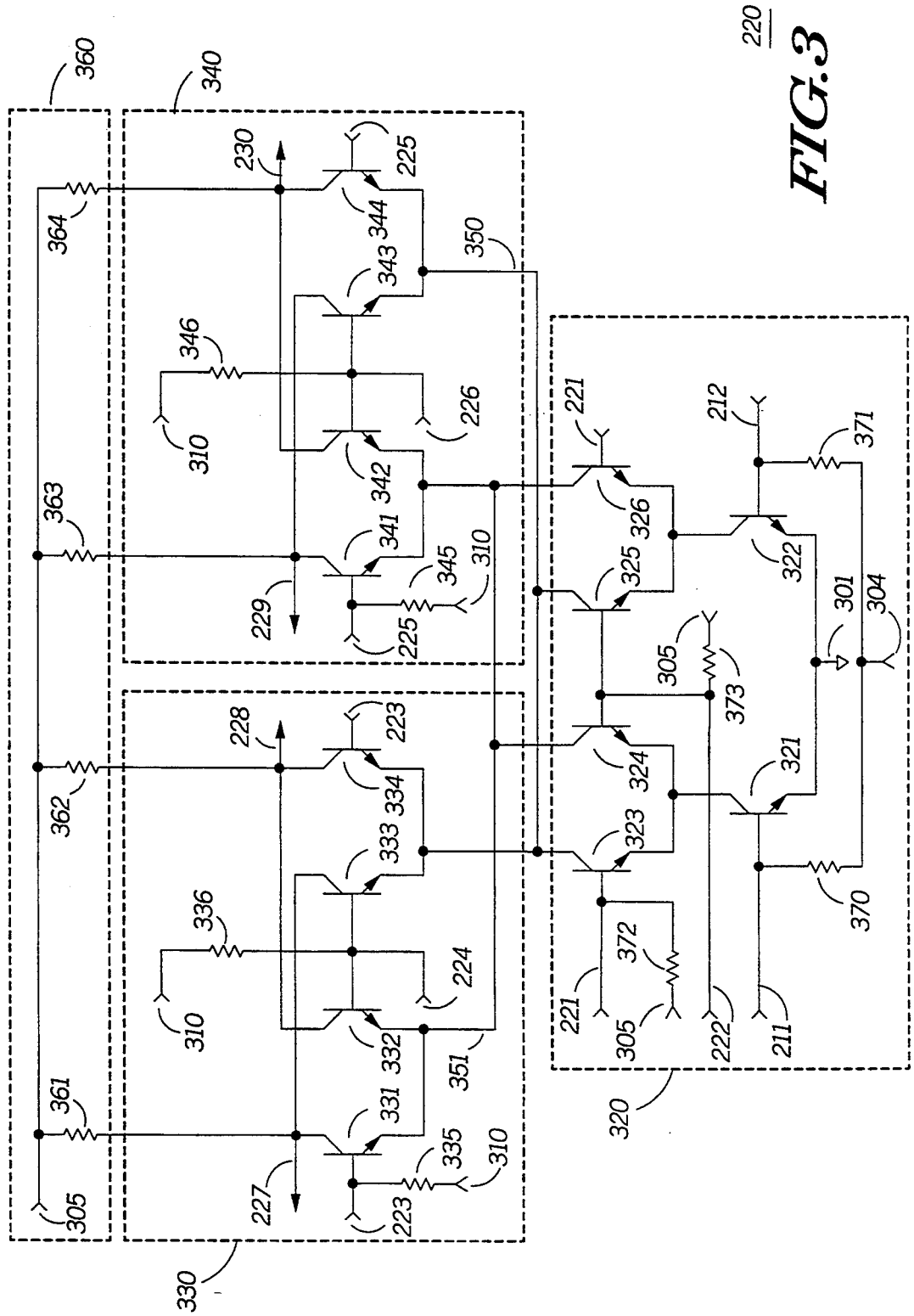
FIG. 3 is an electrical schematic diagram of the stacked, double balanced mixer used in the dual conversion receiver, in accordance with the preferred embodiment of the present invention.

Referring to FIG. 3, an electrical schematic diagram of the stacked, double balanced mixer 220 used in the dual conversion receiver 103 is shown, in accordance with the preferred embodiment of the present invention. The stacked double balanced mixer 220 comprises a double balanced mixer 320, a first cross coupled differential mixer 330, a second cross coupled differential mixer 340, and a power supply 360. Current supplied by the power supply 360 is uniquely coupled in parallel through the first and second cross coupled differential mixers 330, 340, and therefrom in series through the double balanced mixer 320, as will be described more fully below.

The double balanced mixer 320 comprises two input transistors 321, 322, four output transistors 323, 324, 325, 326, and four bias resistors 370, 371, 372, 373. The transistors 321, 322, 323, 324, 325, 326 are preferably NPN transistors each having a control terminal (the base terminal of the NPN transistor), a first output terminal (the emitter terminal of the NPN transistor), and a second output terminal (the collector terminal of the NPN transistor). The first output terminals of the two input transistors 321, 322 are direct current (DC) coupled together and to a first reference voltage 301, which is preferably a ground reference. The control terminals of the two input transistors 321, 322 form the first differential inputs 211, 212 of the stacked, double balanced mixer 220. Each of these is DC coupled to first terminals of the resistors 370, 371, which are bias resistors. The second terminals of the resistors 370, 371 are DC coupled to a bias voltage 304. The first output terminals of the two output transistors 323, 324 are DC coupled to each other and to the second output terminal of the input transistor 321. The first output terminals of the two output transistors 325, 326 are DC coupled to each other and to the second output terminal of the input transistor 322. The control terminals of the two output transistors 323, 326 are DC coupled together, forming a plus node 221 of the second differential inputs 221, 222. The control terminals of the two output transistors 324, 325 are DC coupled together, forming a minus node 222 of the second differential inputs 221, 222. The second differential inputs 221, 222 are further DC coupled, respectively, to first terminals of the resistors 372, 373, which are bias resistors. The second terminals of the resistors 372, 373 are DC coupled to a second reference voltage 305. The second output terminals of the two output transistors 323, 325 are DC coupled together, forming a minus node of a first mixer output of the double balance mixer 320, whereat a minus output portion of a first IF differential output (FIF) signal 350, is generated. The second output terminals of output transistors 324, 326 are DC coupled together, forming a plus node of the first mixer output of the double balance mixer 320, whereat a plus output portion of the first IF differential output signal 351 is generated. The amplified, RF differential signal coupled to the first differential inputs 211, 212 has an RF carrier frequency for example, 930 MHz. The first LO differential signal, having a first LO frequency, for example, of 744 MHz is coupled to second differential inputs 221, 222. The double balanced mixer 320 generates the first intermediate frequency (IF) differential output signal 350, 351 having a first IF frequency at the difference of the RF carrier and first LO frequencies, which is 186 MHz in this example.

In summary, the double balanced mixer 320 comprises two input transistors 321, 322 having second output terminals DC coupled to first output terminal pairs of four cross coupled output transistors 323, 324, 325, 326. The RF differential input signal having the RF carrier frequency and the first LO signal having the LO frequency are inputs to the double balanced mixer 320. The first IF differential output signal is generated by the double balanced mixer 320, having a first IF frequency at the difference of the RF carrier and first LO frequencies The cross coupled interconnection of the four output transistors 323, 324, 325, 326 is defined hereinafter as four cross coupled transistors, which refers to the coupling arrangement described above wherein each of three types (control, first output, and second output) of the terminals of the four cross coupled transistors 323, 324, 325, 326 are DC coupled in differing sets of pairs, that is, the control terminals of the transistors 323, 326 are DC coupled together in a pair, forming a first node for a first differential input signal of the cross coupled transistors 323, 324, 325, 326, and the control terminals of the transistors 324, 325 are DC coupled together in a pair, forming a second node for a first differential input signal of the cross coupled transistors 323, 324, 325, 326, the first output terminals of the transistors 323, 324 are DC coupled together in a pair, forming a first node for a second differential input signal of the cross coupled transistors 323, 324, 325, 326, and the first output terminals of the transistors 325, 326 are DC coupled together in a pair forming a second node for a second differential input signal of the cross coupled transistors 323, 324, 325, 326, and the second output terminals of the transistors 323, 325 are DC coupled together in a pair forming a first node for a differential output signal of the cross coupled transistors 323, 324, 325, 326, and the second output terminals of the transistors 324, 326 are DC coupled together in a pair forming a second node for a differential output signal of the cross coupled transistors 323, 324, 325, 326.

The first cross coupled differential mixer 330 comprises four cross coupled input/output transistors 331, 332, 333, 334 and two bias resistors 335, 336. The first output terminal pair of the cross coupled input/output transistors 331, 332 and the first output terminal pair of the cross coupled input/output transistors 333, 334 form a second mixer differential input of the first cross coupled differential mixer 330. The second output terminal pair of the cross coupled output transistors 323, 325 is DC coupled to the first output terminal pair of the cross coupled input/output transistors 333, 334. The second output terminal pair of the cross coupled output transistors 324, 326 is DC coupled to the first output terminal pair of the cross coupled input/output transistors 331, 332. The first IF differential output signal 350, 351 is thereby DC coupled from the double balanced mixer 320 to the first cross coupled differential mixer 330. The control terminal pair of the cross coupled input/output transistors 331, 334 and the control terminal pair of the cross coupled input/output transistors 332, 333 form second IF differential inputs 223, 224 of the stacked double balanced mixer 220, to which the I signal is coupled. A DC control bias voltage is established at the control terminal pairs of the cross coupled input/output transistors 331, 334 by the bias resistor 335, which is DC coupled to a third reference voltage 310, and a DC control bias voltage is established at the control terminal pairs of the cross coupled input/output transistors 332, 333 by the bias resistor 336, which is DC coupled to the third reference voltage 310. The I signal has a second LO frequency, which is 186 MHz in the example used herein. The first cross coupled differential mixer 330 generates a second IF in-phase differential output (SIFI) signal having a second IF frequency at the difference of the first IF and second LO frequencies, which is baseband (zero MHz) in this example. A plus portion of the SIFI signal is generated at a first node 227 of a second mixer differential output formed by the second output terminal pair of the cross coupled input/output transistors 331, 333. A minus portion of the SIFI signal is generated at a second node 228 of the second mixer differential output formed by the second output terminal pairs of the cross coupled input/output transistors 332, 334.

In summary, the first cross coupled differential mixer 330 comprises four cross coupled input/output transistors 331, 332, 333, 334 having first output terminal pairs DC coupled in series to second output terminal pairs of the cross coupled output transistors 323, 324, 325, 326 of the double balanced mixer 320, and generates an SIFI signal at the second mixer outputs 227, 228 having a frequency at the difference of the first IF frequency and the second IF frequency in response to the first IF differential output signal coupled from the double balance mixer 320 and the I signal coupled to the second IF differential input 223, 224.

The second cross coupled differential mixer 340 comprises four cross coupled input/output transistors 341, 342, 343, 344 and two bias resistors 345, 346. The first output terminal pair of the cross coupled input/output transistors 341, 342 and the first output terminal pair of the cross coupled input/output transistors 343, 344 form a third mixer differential input of the second cross coupled differential mixer 340. The second output terminal pair of the cross coupled output transistors 323, 325 is DC coupled to the first output terminal pair of the cross coupled input/output transistors 343, 344. The second output terminal pair of the cross coupled output transistors 324, 326 is DC coupled to the first output terminal pair of the cross coupled input/output transistors 341, 342. The first IF differential output signal 350, 351 is thereby DC coupled from the double balanced mixer 320 to the second cross coupled differential mixer 340. The control terminal pair of the cross coupled input/output transistors 341, 344 and the control terminal pair of the cross coupled input/output transistors 342, 343 form third IF differential inputs 225, 226 of the stacked double balanced mixer 220, to which the Q signal is coupled. A DC control bias voltage is established at the DC coupled control terminal pairs of the cross coupled input/output transistors 341, 344 by the bias resistor 345, which is DC coupled to the third reference voltage 310, and a DC control bias voltage is established at the DC coupled control terminal pairs of the cross coupled input/output transistors 342, 343 by the bias resistor 346, which is DC coupled to the third reference voltage 310. The Q signal has a second LO frequency which is 186 MHz in the example used herein. The second cross coupled differential mixer 340 generates a second IF quadrature differential output (SIFQ) signal having the second IF frequency at the difference of the first IF and second LO frequencies, which is baseband (zero MHz) in this example. A plus portion of the SIFQ signal is generated at a first node 229 of a third mixer output formed by the second output terminal pair of the cross coupled input/output transistors 341, 343. A minus portion of the SIFQ signal is generated at a second node 230 of the third mixer output formed by the second output terminal pair of the cross coupled input/output transistors 342, 344.

In summary, the second cross coupled differential mixer 340 comprises four cross coupled input/output transistors 341, 342, 343, 344 having first output terminal pairs DC coupled in series to second output terminal pairs of the cross coupled output transistors 323, 324, 325, 326 of the double balanced mixer 320, and generates an SIFQ signal at the third mixer outputs 229, 230 having a frequency at the difference of the first IF frequency and the second IF frequency in response to the first IF differential output signal coupled from the double balance mixer 320 and the Q signal coupled to the third differential inputs 225, 226.

It will be appreciated that the second differential inputs 223, 224 of the first cross coupled differential mixer 330 can alternatively be coupled to a second LO differential signal having a second LO frequency, while the third differential inputs 225, 226 of the first cross coupled differential mixer 330 can alternatively be coupled to a third LO differential signal having a third LO frequency, resulting in the simultaneous generation of a second mixer output signal having a second IF frequency and a third mixer output signal having a third IF frequency, respectively, at the second and third mixer outputs 227, 228, 229, 230 of the first and second cross coupled differential mixers 330, 340.

The power supply 360 comprises four power supply resistors 361, 362, 363, 364. A first terminal of each the four power supply resistors 361, 362, 363, 364 is DC coupled to the second reference voltage 305. A second terminal of each of the four power supply resistors 361, 362, 363, 364 is DC coupled, respectively, to the second output terminals of the four cross coupled input/output transistors 331, 334, 341, 344. It will be appreciated that because of the unique coupling of the power supply 360, the first cross coupled differential mixer 330, the second cross coupled differential mixer 340, and the double balanced mixer 320; the supply current is DC coupled from the second voltage reference 305 in parallel through the four power supply resistors 361, 362, 363, 364, wherefrom the supply current is DC coupled in series to the eight cross coupled input/output transistors 331–334, 341–344, wherein the supply current is DC coupled in parallel, and wherefrom the supply current is DC coupled in series to the four cross coupled output transistors 323–326, wherein the supply current is DC coupled in parallel, and wherefrom the supply current is DC coupled in series to the two input transistors 321, 322, wherein the supply current is DC coupled in parallel, and wherefrom the supply current is DC coupled in series to the first voltage reference 301, thereby powering the fourteen transistors 321-326, 331-334, 341-344.

In the preferred embodiment of the present invention, the first reference voltage 301 is ground, the bias reference voltage 304 is 0.78 volts, the second reference voltage 305 is less than or equal to 1.00 volts DC, the third reference voltage 310 is 1.25 volts DC, the bias resistors 370-373, 335, 336, 345, 346 have a value of 10K Ohms, and the power supply resistors 361-364 have a value of 1.6K Ohms. The geometries of the transistors 321-326, 331-334, 341-344 are designed so that the transistors provide optimum gain and noise figure at the highest operating frequencies, which in this example are 930 MHz for the transistors 321-326 in the double balanced mixer 320 and 186 MHz for the transistors 331-334, 341-344 in the cross coupled differential mixers 330, 340. The values of resistors, reference voltages, and transistor geometries are further chosen to establish a collector to emitter DC voltage of the transistors 321-326 of approximately 250 millivolts, a collector to emitter DC voltage of the transistors 331-334, 341-344 of approximately 300 millivolts, and a DC voltage drop across each of the power supply resistors 361-364 of approximately 200 millivolts, without significant degradation of gain and noise performance of the transistors 321-326, 331-334, 341-344 Accordingly, the current drain from the second reference voltage 305 of the power supply 360 is approximately 125 microamps through each power supply resistor 361-364. The design of the geometries of the transistors 321-326, 331-334, 341-344 to optimize the gain, noise, and operating voltage is well known to one of ordinary skill in the art. It will be appreciated that the second reference voltage 305 value is the sum of the collector-emitter voltage drops of, for example, transistor 321 (250 millivolts) and transistor 323 (250 millivolts), transistor 331 (300 millivolts), and supply resistor 361 (200 millivolts), which is obtainable from a single cell battery, such as a NiCad battery, without requiring AC conversion of the single cell voltage to a higher voltage. In other words, the second reference voltage is DC coupled through four bias resistors, each bias resistor (e.g., resistor 361) coupling current from the second reference voltage 305 through first and second output terminals of two of the input/output transistors (331, 333) in parallel, therefrom in series through first and second output terminals of the four output transistors in parallel (323-326), and therefrom in series through first and second output terminals the two input transistors (321,322) in parallel. The voltage drop across each of the bias resistors 370-373, 335, 336, 345, 346 is approximately 50 millivolts. The third reference voltage 310 supplies only the base currents for the transistors 331-334, 341-344, and is approximately 6 microamps. The third reference voltage 310 is at a slightly higher value of approximately 1.25 volts, which, because of the extremely small current requirement, can be easily obtained by use of a simple charge pump circuit, well known in the art, or derived from a voltage reference source (not shown) supplying other higher voltage circuits, such as for example the controller 106. It will be appreciated that the reference voltage coupled to resistors 372, 373, which is used to bias the control terminals of the transistors 323-326, can alternately be a reference voltage having another value, such as 1.05 volts DC.

The fourteen transistors 321-326, 331-334, 341-344 and the twelve resistors 370-373, 335, 336, 345, 346, 361-364 are preferably implemented on the same substrate, which results in very uniform DC values of the parallel supply currents flowing through the transistors 321-326, 331-334, 341-344, and very uniform values of DC voltages at the terminals of the transistors 321-326, 331-334, 341-344. The uniform supply currents and DC voltages reduce the generation of distortion products in the stacked double balanced mixer 220. It will be further appreciated that the unique stacked arrangement of the double balanced mixer 320 and cross coupled differential mixers 330, 340 allows the stacked double balanced mixer 220 to be operated with very low power (approximately 0.5 milliwatts) because the supply current is shared by the double balanced mixer 320 and the first and second cross coupled differential mixers 330, 340. It will be appreciated that the values of the parts described herein can be varied significantly and the circuit will still provide the benefits described herein.

In summary, the stacked, double balanced mixer 220 performs a dual conversion of the frequency of the intercepted RF signal, generating SIFI and SIFQ signals each having a frequency equivalent to the difference of the carrier frequency of the RF differential signal coupled from the antenna 113 and the first and second LO frequencies. In the preferred embodiment of the present invention, the first and second LO frequencies are generated at frequencies chosen such that the SIFI and SIFQ signals are at baseband.

Figure 4:
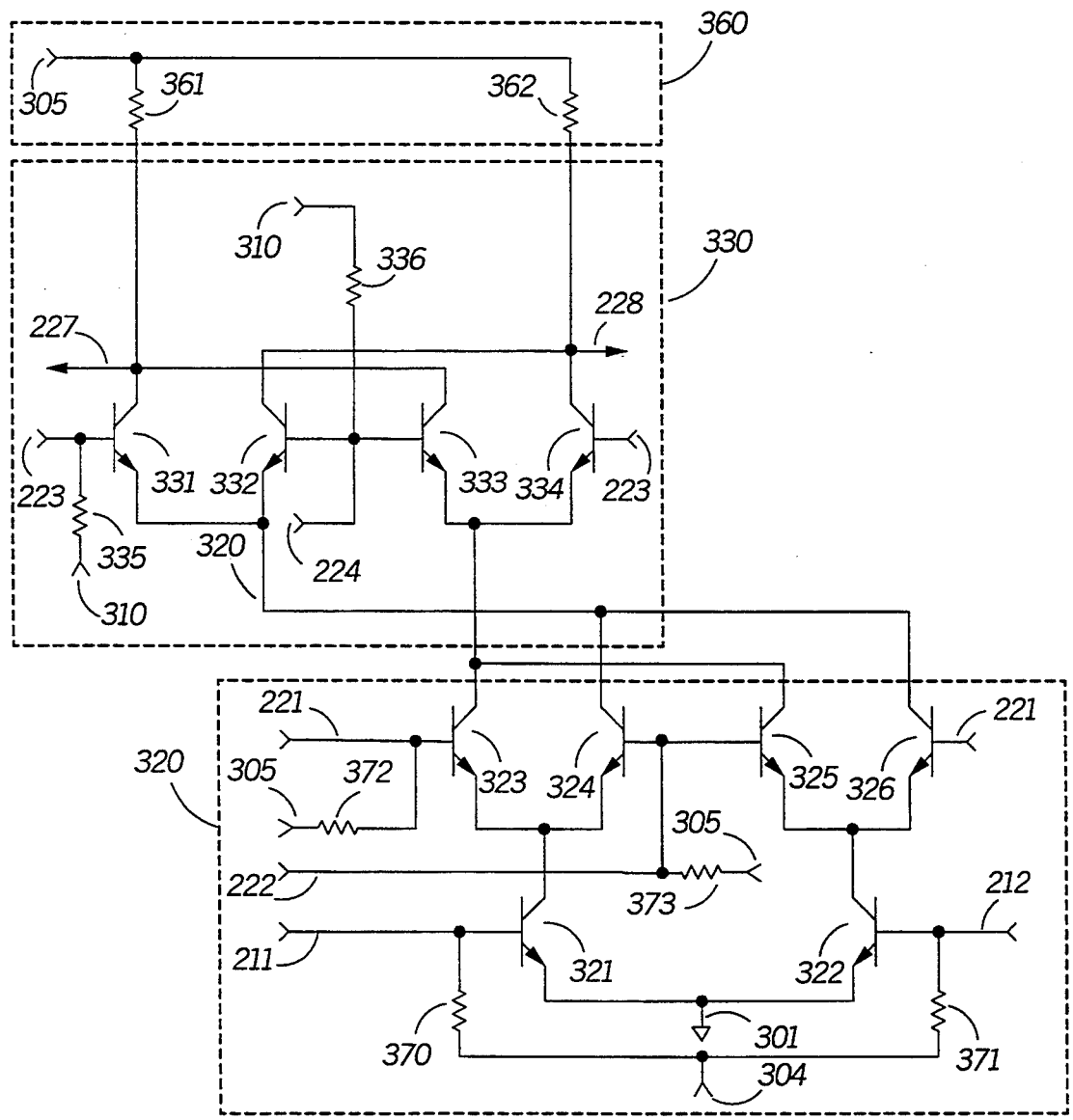
FIG. 4 is an electrical schematic diagram of the stacked, double balanced mixer used in the dual conversion receiver, in accordance with an alternative embodiment of the present invention.

Referring to FIG. 4, the stacked double balanced mixer 220 is shown in accordance with an alternative embodiment of the present invention, which is identical to the preferred embodiment of the present invention except for having the second cross coupled differential mixer 340 and the supply resistors 363, 364 deleted therefrom. The alternative embodiment of the present invention is useful in receivers operating in communication systems wherein in-phase and quadrature IF signals are not needed to be recovered, such as in a non-coherent frequency modulation system.

In the alternative embodiment of the present invention, the reference voltages. 301,304, 305, 310, the bias resistors 370-373, 335, 336 and the geometries of the transistors 321-326, 331-334 are the same as in the preferred embodiment of the present invention. The values of the power supply resistors are designed to be 0.8K Ohms. As result, the collector-emitter voltages across the transistors 321-326, 331-334, the total power requirements, and the performance advantages are the same as for the preferred embodiment of the present invention.

It will be appreciated that the second IF signal may be generated in the preferred and alternative embodiments having a frequency which is a combination of sums or differences of the RF carrier frequency, the first LO frequency, and the second LO frequency, as is well known to one of ordinary skill in the art.

It will be further appreciated that, for both the preferred and alternative embodiments of the present invention, in situations where lower gain is acceptable, the input transistors 321 and 322 may alternatively be field effect transistors (FETs). Similarly, cross coupled transistors 323-326, 331-334, 341-344 may alternatively be FETs where lower gain is acceptable. The FETs are substituted for the NPN transistors in a manner well known in the art with appropriate modification of the values of the resistors 370-373, 335, 336, 345, 346, 361-364. The control terminal of each FET is the gate, the first output terminal is the source and the second output terminal is the drain. The use of FETs reduces intermodulation distortions in the double balanced mixer 320.

In prior art dual conversion receivers, a first IF output of a first double balanced mixer similar to the double balanced mixer 320 described above is typically converted from a current signal and coupled, as a voltage signal, to a first input of a second double balanced mixer similar to the double balanced mixer 320, wherein the signal is reconverted to a current signal and mixed with the second LO. In such designs the two double balanced mixers operate from independent power supplies. The result of independently powering the double balanced mixers and converting the signal from a current signal to a voltage signal and then back to a current signal is the generation of distortion components in the signal. It will be appreciated that the preferred and alternative embodiments of the present invention avoid the generation of such distortion components in the manners described.

By now it should be appreciated that the stacked double balanced mixer described in the preferred and alternative embodiments of the present invention, performs the dual conversion of an RF signal with fewer transistors and reduced power compared to circuits performing the same function in prior art dual conversion receivers. Furthermore, the second IF signal is generated with reduced distortion products, such as intermodulation distortion, due to the sharing of the supply current and DC coupling of the first IF signal.

I claim:

1. A stacked double balanced mixer, comprising:
   a double balanced mixer comprising:
      two input transistors;
      four cross coupled output transistors;
      first inputs of said two input transistors coupled to a radio frequency (RF) differential signal having an RF carrier frequency; and
      second inputs of said four cross coupled output transistors coupled to a first local oscillator differential signal having a first LO frequency; and
   a first cross coupled differential mixer comprising:
      four cross coupled input/output transistors;
      two inputs of said four cross coupled input/output transistors coupled to a second local oscillator (LO) differential signal having a second LO frequency; and
      first cross coupled differential mixer outputs of said four cross coupled input/output transistor; and
   wherein said four cross coupled input/output transistor have first output terminal pairs DC coupled in series to second output terminal pairs of said four cross coupled output transistor; and
   wherein the stacked double balanced mixer generates, at the first cross coupled differential mixer outputs, an IF differential output signal having an IF frequency equal to a difference of the RF carrier frequency and the sum of the first and the second LO frequencies.

2. The stacked double balanced mixer according to claim 1,
   wherein said first inputs comprise two control terminals, and wherein each of the two control terminals is a control terminal of one of said two input transistors; and
   wherein said second inputs comprise two first output terminal pairs of said four cross coupled output transistor; and
   wherein said two inputs comprise two pairs of control terminals of said four cross coupled input/output transistor; and
   wherein said first cross coupled differential mixer outputs comprise two second output terminal pairs of said four cross coupled input/output transistor.

3. The stacked double balanced mixer according to claim 1, further comprising a reference voltage and two bias resistors, each bias resistor coupling direct current from the reference voltage through second output terminal pairs of said four cross coupled input/output transistor in parallel, therefrom in series through said four cross coupled output transistors in parallel, and therefrom in series through said two input transistors in parallel.

4. The stacked double balanced mixer according to claim 3, wherein the reference voltage has a value equal to or less than 1.00 volts.

5. The stacked double balanced mixer according to claim 1, wherein each of said two input, four cross coupled output, and four cross coupled input/output transistors is an NPN transistor, and wherein a control terminal, first output terminal and second output terminal of each of the NPN transistors are, respectively, base, emitter, and collector of the NPN transistor.

6. The stacked double balanced mixer according to claim 1, wherein the double balanced mixer and the first cross coupled differential mixer are implemented on the same integrated circuit substrate.

7. The stacked double balanced mixer according to claim 1, further comprising:
   a second cross coupled differential mixer comprising:
      a second set of four cross coupled input/output transistors, wherein said second set of four cross coupled input/output transistors have first output terminal pairs DC coupled in series to said second output terminal pairs of said four cross coupled output transistor;
      two inputs of said second set of four cross coupled input/output transistors coupled to a third local oscillator (LO) differential signal having a third LO frequency; and
      second cross coupled differential mixer output; and
   wherein the stacked double balanced mixer generates, at the second cross coupled differential mixer outputs, a second IF differential output signal having a second IF frequency equal to a difference of the RF carrier frequency and the sum of the first and the third LO frequencies.

8. The stacked double balanced mixer according to claim 7,
   wherein said two inputs of said second set of four cross coupled input/output transistor comprise two pairs of control terminals; and
   wherein said second cross coupled differential mixer outputs comprises two pairs of second output terminals of said second set of four cross coupled input/output transistors.

9. The stacked double balanced mixer according to claim 1,
   wherein said two input transistors each has a second output terminal direct current (DC) coupled respectively to one of two first output terminal pairs of said four cross coupled output transistor.

10. A receiving device for processing a frequency modulated (FM) ratio signal having a carrier frequency, the FM radio signal including a selective call address, the receiving device comprising:

an antenna for intercepting the FM signal;

a receiver section, coupled to said antenna, for filtering, converting, and demodulating the intercepted FM signal, including the selective call address;

a controller, coupled to said receiver section, for decoding the demodulated selective call address, and which generates an alert signal when the selective call address substantially matches an address stored in the receiving device; and a sensible alert, coupled to the controller, which is responsive to the alert signal for generating a sensible alert; and wherein the receiver section comprises a stacked double balanced mixer, coupled to said antenna, for converting the intercepted FM signal; and wherein the stacked double balanced mixer comprises:

a double balanced mixer comprising;

two input transistor;

four cross coupled output transistor;

first input of said two input transistors coupled to a radio frequency (RF) differential signal having an RF carrier frequency; and second inputs of said four cross coupled output transistors coupled to a first local oscillator (LO) differential signal having a first LO frequency; and a first cross coupled differential mixer comprising:

four cross coupled input/output transistors;

two inputs of said four cross coupled input/output transistors coupled to a second local oscillator (LO) differential signal having a second LO frequency; and first cross coupled differential mixer outputs of said four cross coupled input/output transistors; and wherein said four cross coupled input/output transistors have first output terminal pairs DC coupled in series to second output terminal pairs of said four cross coupled output transistors; and wherein the stacked double balanced mixer generates, at the first cross coupled differential mixer outputs, an IF differential output signal having an IF frequency equal to a difference of the RF carrier frequency and the sum of the first and the second LO frequencies.

11. The receiving device according to claim 10, wherein said first inputs comprise two control terminals, and wherein each of the two control terminals is a control terminal of one of said two input transistors; and wherein said second inputs comprise two first output terminal pairs of said four cross coupled output transistors; and wherein said two inputs comprise two pairs of control terminals of said four cross coupled input/output transistors; and wherein said first cross coupled differential mixer outputs comprise two second output terminal pairs of said four cross coupled input/output transistors.

12. The receiving device according to claim 10, further comprising a reference voltage and two bias resistors, each bias resistor coupling direct current from the reference voltage through second output terminal pairs of said four cross coupled input/output transistors in parallel, therefrom in series through said four cross coupled output transistors in parallel, and therefrom in series through said two input transistors in parallel.

13. The receiving device according to claim 12, wherein the reference voltage has a value equal to or less than 1.00 volts.

14. The receiving device according to claim 12, wherein each of said two input, four cross coupled output, and four cross coupled input/output transistors is an NPN transistor, and wherein a control terminal, first output terminal and second output terminal of each of the NPN transistors are, respectively, base, emitter, and collector of the NPN transistor.

15. The receiving device according to claim 10 wherein the double balanced mixer and the first cross coupled differential mixer are implemented on the same integrated circuit substrate.

16. The receiving device according to claim 10 further comprising:

a second cross coupled differential mixer comprising:

a second set of four cross coupled input/output transistors, wherein said second set of four cross coupled input/output transistors have first output terminal pairs DC coupled in series to said second output terminal pairs of said four cross coupled output transistors;

two inputs of said second set of four cross coupled input/output transistors coupled to a third local oscillator (LO) differential signal having a third LO frequency; and second cross coupled differential mixer outputs; and wherein the stacked double balanced mixer generates, at the second cross coupled differential mixer outputs, a second IF differential output signal having a second IF frequency equal to a difference of the RF carrier frequency and the sum of the first and the third LO frequencies.

17. The receiving device according to claim 16, wherein said two inputs of said second set of four cross coupled input/output transistors comprise two pairs of control terminals; and wherein said second cross coupled differential mixer outputs comprises two pairs of second output terminals of said second set of four cross coupled input/output transistors.

18. The stacked double balanced mixer according to claim 10, wherein said two input transistors each has a second output terminal direct current (DC) coupled respectively to one of two first output terminal pairs of said four cross coupled output transistors.

19. A stacked double balanced mixer, comprising:

a double balanced mixer comprising:

two NPN input transistors and four cross coupled output transistors, wherein each of said two NPN input transistors has a collector which is direct current (DC) coupled, respectively, to one of two emitter pairs of said four cross coupled output transistors;

first input comprising two bases, wherein each of the two bases is a base of one of said two NPN input transistors, said first inputs coupled to a radio frequency (RF) differential signal having an RF carrier frequency; and first LO inputs comprising two base pairs of said four cross coupled output transistors, said first LO inputs coupled to a first local oscillator (LO) differential signal having a first LO frequency; and a first cross coupled differential mixer, comprising:

four cross coupled input/output transistors having two emitter pairs DC coupled in series to two collector pairs of said four cross coupled output transistors;

second LO inputs comprising two input/output transistors, said second LO inputs coupled to a second local oscillator (LO) differential signal having a second LO frequency; and differential mixer outputs comprising two collector pairs of said four cross coupled input/output transistors; and wherein the stacked double balanced mixer generates, at the differential mixer outputs, a second IF differential output signal having a second IF frequency equal to a difference of the RF carrier frequency and the sum of the first LO frequency and the second LO frequency; and wherein the double balance mixer and the first cross coupled differential mixer are implemented on the same integrated circuit substrate.

* * * * *

UNITED STATES PATENT AND TRADEMARK OFFICE
CERTIFICATE OF CORRECTION

PATENT NO. : 5,448,772
DATED : September 5, 1995
INVENTOR(S) : Walter J. Grandfield Page 1 of 2

It is certified that error appears in the above-indentified patent and that said Letters Patent is hereby corrected as shown below:

Column 11, line 40, after oscillator insert --(LO)--.

Column 11, line 49, delete "transistor" and insert --transistors--.

Column 11, line 51, change "transistor" to --transistors--.

Column 11, line 53, change "transistor" to --transistors--.

Coulumn 11, line 68, change "transistor" to --transistors--.

Column 12, lines 3, 6, 12, 52, 64, change "transistor" to --transistors--.

Column 12, line 17, after 3 delete ",".

Column 12, line 66, delete "ratio" and insert --radio--.

Column 13, lines 19 & 20, change "transistor" to --transistors--.

Column 13, line 21, after first change "input" to --inputs--.

Column 14, line 15, after 10 insert --,--.

Column 14, line 58, change "input" to --inputs--.

UNITED STATES PATENT AND TRADEMARK OFFICE
CERTIFICATE OF CORRECTION

PATENT NO. : 5,448,772
DATED : September 5, 1995
INVENTOR(S) : Walter J. Grandfield It is certified that error appears in the above-indentified patent and that said Letters Patent is hereby corrected as shown below:

Column 15, line 8, after two insert --base pairs of said four cross coupled--.

Signed and Sealed this

Twenty-sixth Day of December, 1995

Attest:

BRUCE LEHMAN

Attesting Officer    Commissioner of Patents and Trademarks